(12) United States Patent
Xiu (10) Patent No.: US 10,541,696 B2
(45) Date of Patent: Jan. 21, 2020

(54) METHOD OF CONTROLLING ELECTRONIC DEVICE AND ELECTRONIC DEVICE

(71) Applicant: BOE TECHNOLOGY GROUP CO., LTD., Beijing (CN)

(72) Inventor: Liming Xiu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/215,857

(22) Filed: Dec. 11, 2018

(65) Prior Publication Data

US 2019/0238143 A1     Aug. 1, 2019

(30) Foreign Application Priority Data

Jan. 31, 2018    (CN) .......................... 2018 1 0097129

(51) Int. Cl.
*H03L 7/099*    (2006.01)
*G06F 1/04*     (2006.01)
*H03L 7/16*     (2006.01)

(52) U.S. Cl.
CPC ............... *H03L 7/099* (2013.01); *G06F 1/04* (2013.01); *H03L 7/16* (2013.01)

(58) Field of Classification Search
CPC ............. H03L 7/099; H03L 7/16; G06F 1/04
USPC ........................................ 327/156, 158, 161
See application file for complete search history.

(56) References Cited

U.S. PATENT DOCUMENTS

| | | | |
|---|---|---|---|
| 8,890,591 B1 * | 11/2014 | Xiu | H03L 1/022 327/147 |
| 9,379,714 B1 * | 6/2016 | Xiu | G04F 10/005 |
| 9,621,173 B1 * | 4/2017 | Xiu | H03L 7/197 |

OTHER PUBLICATIONS

Liming Xiu, "From Frequency to Time-Average-Frequency a Paradigm Shift in the Design of Electronic System", IEEE Press Series on Microelectronic Systems, Wiley Publication, 2015, ISBN:978-1-110-027324-4, 179 pages.
Liming Xiu, "Nanometer Frequency Synthesis Beyond the Phase-Locked Loop", IEEE Press, Wiley Publication, 2012, ISBN 978-1-118-16263-7 (cloth), 334 pages.

* cited by examiner

*Primary Examiner* — John W Poos
(74) *Attorney, Agent, or Firm* — Calfee, Halter & Griswold LLP (57) ABSTRACT

An electronic device includes: an acquisition circuit, configured to collect the current environmental information for characterizing the environment of the electronic device; a processing circuit, configured to receive the current environmental information from the acquisition circuit; determine a target frequency control word corresponding to the current environmental information according to a preset expected operating status of the electronic device; and input the target frequency control word to the TAF-DPS clock generator; the TAF-DPS clock generator, configured to generate a clock signal according to the target frequency control word, and output the clock signal to a functional circuit; the functional circuit, configured to operate in accordance with the clock signal to make the electronic device reach the expected operating status.

14 Claims, 10 Drawing Sheets

METHOD OF CONTROLLING ELECTRONIC DEVICE AND ELECTRONIC DEVICE

CROSS REFERENCE

This application is based upon and claims priority to Chinese Patent Application No. 201810097129.7, filed on Jan. 31, 2018, the entire contents thereof are incorporated herein by reference.

TECHNICAL FIELD

The present disclosure relates to the field of controlling an electronic device, and in particular, to a method of controlling an electronic device and an electronic device.

BACKGROUND

The frequency source is the basic signal source of the electronic system and can be applied in electronic systems such as military, metrology, industrial, consumer, communication network, automobile, power grid, radar, communication, measurement and control, and navigation and the like.

In the related art, a clock signal with fixed frequency provided by a frequency source is sufficient for most applications. For this reason, clock generators typically focus on providing a clock signal that guarantees high frequency stability for any given application. A clock signal of this nature can be referred to as a strict (or precise) clock. With the development of electronic technology, the complexity of IC design (Integrated Circuit Design) has reached a high level.

It should be noted that the information disclosed in the background section above is only for enhancing the understanding of the background of the present disclosure, and thus may include information that does not constitute prior art known to those of ordinary skill in the art.

SUMMARY

In view of the above problems, the purpose of embodiments of the present disclosure is to provide a method of controlling an electronic device and an electronic device.

Embodiments of the present disclosure provide the following technical solutions:

In one aspect, an embodiment of the present disclosure provides an electronic device, including: an acquisition circuit, configured to collect current environmental information for characterizing an environment of the electronic device; a processing circuit, configured to receive the current environmental information from the acquisition circuit; determine a target frequency control word corresponding to the current environmental information according to a preset expected operating status of the electronic device; and input the target frequency control word to a TAF-DPS (Time-Average-Frequency Direct Period Synthesis) clock generator; the TAF-DPS clock generator, configured to generate a clock signal according to the target frequency control word, and output the clock signal to a functional circuit; and the functional circuit, configured to operate in accordance with the clock signal to make the electronic device reach the expected operating status.

In other embodiments of the present disclosure, the processing circuit is configured to determine an expected operating parameter corresponding to the current environmental information according to the preset expected operating status of the electronic device; and obtain the target frequency control word corresponding to the expected operating parameter according to a preset mapping relationship between operating parameters and frequency control words.

In other embodiments of the present disclosure, the processing circuit is configured as an environmental assessment sub-circuit and a digital signal processing sub-circuit; the environmental situation assessment sub-circuit is configured to determine a target operating status corresponding to the current environmental information according to the preset expected operating status of the electronic device; and obtain the expected operating parameter corresponding to the target operating status; and the digital signal processing sub-circuit is configured to search for the expected operating parameter in the mapping relationship; and acquire corresponding target frequency control word in the case where the expected operating parameter is found.

In other embodiments of the present disclosure, the current environmental information includes: one or a combination of ambient temperature, supply voltage, data rate, computing workload, battery power, electromagnetic interference requirements, data load.

In other embodiments of the present disclosure, the TAF-DPS clock generator, includes: a reference time unit generating circuit, configured to generate a reference time unit; a signal generating circuit, configured to receive the target frequency control word from the processing circuit and receive the reference time unit from the reference time unit generating circuit; and generate the clock signal according to the reference time unit and the target frequency control word, wherein a frequency of the clock signal is controlled by the target frequency control word.

In other embodiments of the present disclosure, the reference time unit generating circuit includes: a voltage controlled oscillator, a phase locked loop circuit, and K output terminals; wherein the voltage controlled oscillator oscillates at a predetermined oscillation frequency, the phase locked loop circuit locks an output frequency of the voltage controlled oscillator to a reference frequency; and the K output terminals output K output signals having equally-spaced phases, wherein K is a positive integer greater than 1, the reference time unit is a span between any two adjacent output signals output by the K outputs.

In other embodiments of the present disclosure, the signal generating circuit includes: a first input, configured to receive the reference time unit; a second input, configured to receive the target frequency control word F; a direct period synthesis sub-circuit, configured to create a first period $T_A$ and a second period $T_B$ different from the first period $T_A$ according to the reference time unit and the target frequency control word F; generate the clock signal by interleaving a first pulse signal having the first period $T_A$ and a second pulse signal having the second period $T_B$; and an output, configured to output the clock signal to the functional circuit.

In other embodiments of the present disclosure, F=I+r, I is an integer part, r is a fractional part, 0≤r<1; the first period $T_A=I \times \Delta$, the second period $T_B=(I+1) \times \Delta = T_A + \Delta$; t and a proportion of the first period $T_A$ and a proportion of the second period $T_B$ respectively in the clock signal is controlled by r.

In other embodiments of the present disclosure, the time average frequency of the clock signal is:

$$f_{TAF}=1/T_{TAF}=1/[(1-r) \times T_A + r \times T_B]$$

wherein, $T_{TAF}$ is a time average period of the clock signal.

In other embodiments of the present disclosure, the direct period synthesis sub-circuit includes: a first K→1 multiplexer, an accumulator with registered output and a DFF (D-type flip-flop) configured as a toggle flip-flop; wherein the first K→1 multiplexer is configured to receive the K output signals from the first input and a first code address from the registered accumulator, and select one output signal from the K output signals to output to the DFF according to the first code address; the accumulator with registered output is configured to receive the target frequency control word F from the second input, and accumulate the target frequency control word F to generate the first code address and output to the first K→1 multiplexer; and the DFF is configured to receive an output signal from the first K→1 multiplexer; and invert the output signal to generate and output the clock signal.

In other embodiments of the present disclosure, the accumulator with registered output includes: a register and an accumulator, the register being configured to register the integer part and the fractional part of the target frequency control word F, respectively.

In other embodiments of the present disclosure, the direct period synthesis sub-circuit further includes: a second K→1 multiplexer, an adder, and a 2→1 multiplexer; wherein, the first K→1 multiplexer is further configured to select one output signal from the K output signals to output to the 2→1 multiplexer according to the first code address; the second K→1 multiplexer is configured to receive K output signals from the first input and a second code address from the adder, and select one output signal from the K output signals to output to the 2→1 multiplexer according to the second code address; the adder is configured to receive F/2 from a third input, and performing adding on the F/2 to generate the second code address and output to the second K→1 multiplexer; the 2→1 multiplexer is configured to receive output signals from the first K→1 multiplexer and the second K→1 multiplexer, respectively, and select an output signal among the output signals to output to the DFF; the DFF is configured to receive one output signal from the 2→1 multiplexer; and invert the one output signal to generate and output the clock signal.

In one aspect, an embodiment of the present disclosure provides a method of controlling an electronic device, which is applied to the electronic device in one or more of the foregoing technical solutions, the method including: collecting the current environmental information for characterizing the environment of the electronic device; determining the target frequency control word corresponding to the current environmental information according to the preset expected operating status of the electronic device; and inputting the target frequency control word to the TAF-DPS (Time-Average-Frequency Direct Period Synthesis) clock generator; generating the clock signal according to the target frequency control word, and output the clock signal to the functional circuit; operating in accordance with the clock signal to make the electronic device reach the expected operating status.

In other embodiments of the present disclosure, the determining the target frequency control word corresponding to the current environmental information according to the preset expected operating status of the electronic device includes: determining an expected operating parameter corresponding to the current environmental information according to the preset expected operating status of the electronic device; and obtaining the target frequency control word corresponding to the expected operating parameter according to a preset mapping relationship between operating parameters and frequency control words.

In other embodiments of the present disclosure, the determining an expected operating parameter corresponding to the current environmental information according to the preset expected operating status of the electronic device includes: determining a target operating status corresponding to the current environmental information according to the preset expected operating status of the electronic device; and obtaining the expected operating parameter corresponding to the target operating status; and correspondingly, the obtaining the target frequency control word corresponding to the expected operating parameter according to a preset mapping relationship between operating parameters and frequency control words includes: searching for the expected operating parameter in the mapping relationship; and acquiring the corresponding target frequency control word in the case where the expected operating parameter is found.

In other embodiments of the present disclosure, the current environmental information includes: one or a combination of an ambient temperature, a supply voltage, a data rate, a computing workload, a battery power, an electromagnetic interference requirement, and a data load.

It should be understood that the above general description and the following detailed description are merely exemplary and explanatory, and are not limiting of the disclosure.

BRIEF DESCRIPTION OF THE DRAWINGS

In order to more clearly illustrate the embodiments of the present disclosure or the technical solutions in the prior art, the drawings to be used in the embodiments or the description of the prior art will be briefly described below. Obviously, the drawings in the following description are some embodiments of the present disclosure, and other drawings can be obtained based on these drawings for those skilled in the art without any creative labor.

DETAILED DESCRIPTION

The technical solutions in the embodiments of the present disclosure will be clearly and completely described below in conjunction with the accompanying drawings. Obviously, the described embodiments are part of the embodiments of the present disclosure, and not all of the embodiments. Other drawings can be obtained based on these drawings for those skilled in the art without any creative labor.

First, the TAF-DPS clock generator and its operating principle will be described.

Figure 1:
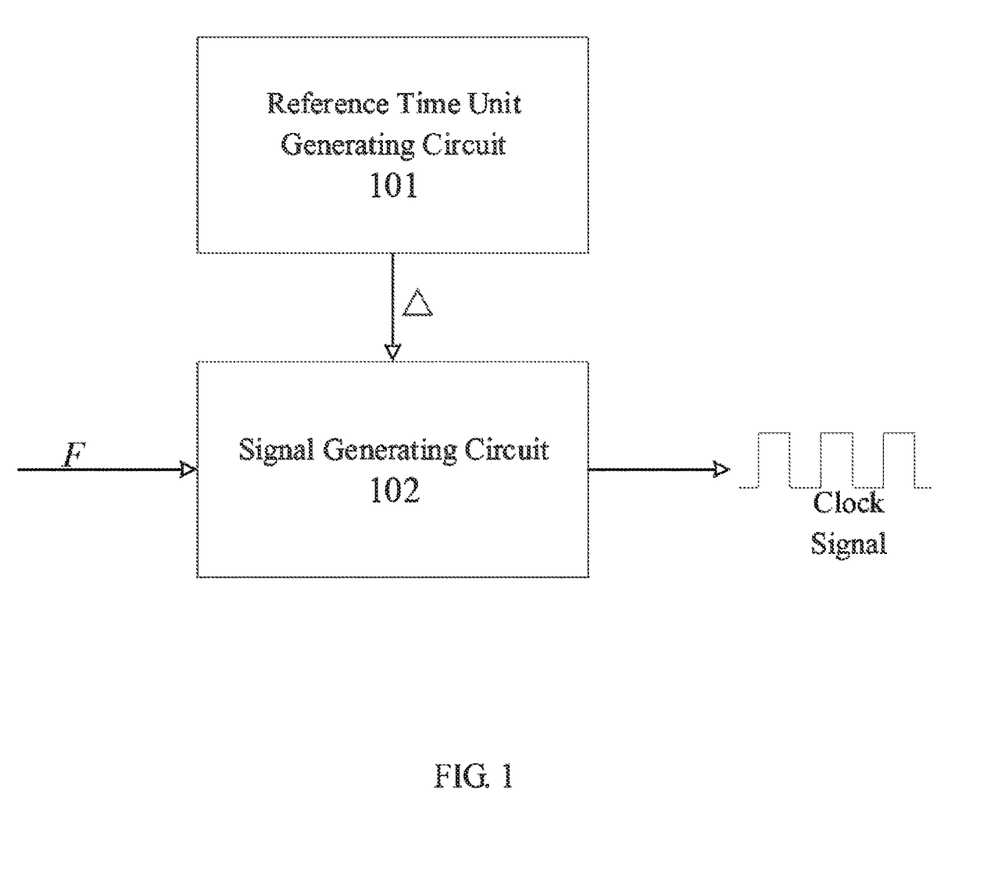
FIG. 1 is a schematic structural diagram of a TAF-DPS clock generator in an embodiment of the present disclosure.

FIG. 1 is a schematic structural diagram of a TAF-DPS clock generator in an embodiment of the present disclosure, referring to FIG. 1, the TAF-DPS clock generator 100 includes: a reference time unit generating circuit 101, configured to generate a reference time unit; a signal generating circuit 102, configured to receive the target frequency control word from the processing circuit and receiving the reference time unit from the reference time unit generating circuit; generate the clock signal controlled by the target frequency control word, according to the reference time unit and the target frequency control word.

In practical applications, the reference time unit generating circuit may include: a voltage controlled oscillator, a phase locked loop circuit and K output terminals; wherein the voltage controlled oscillator oscillates at a predetermined oscillation frequency, a phase locked loop circuit locks an output frequency of the voltage controlled oscillator to a reference frequency; the K output terminals output K output signals having equally-spaced phases, K is a positive integer greater than 1, the reference time unit is a span between any two adjacent output signals output by the K output terminals.

Figure 2:
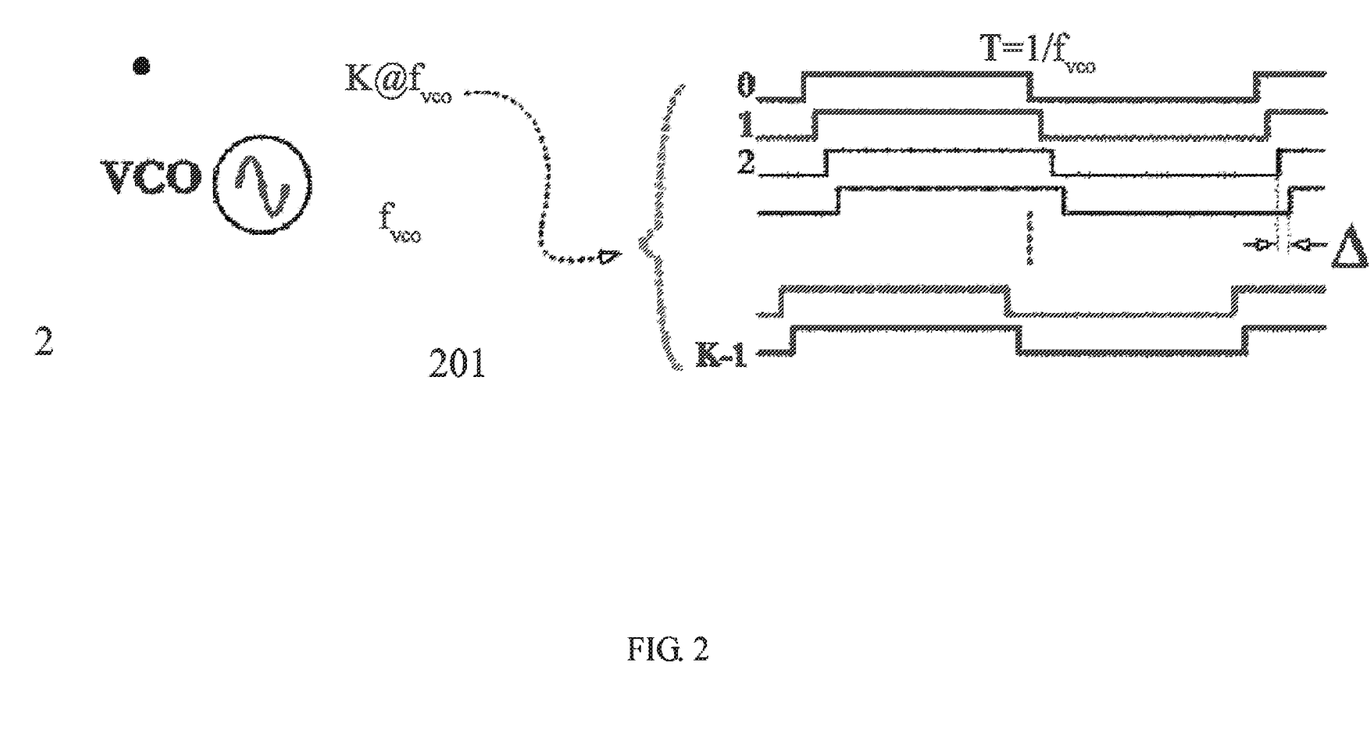
FIG. 2 is a schematic diagram of a voltage controlled oscillator VCO that generates a reference time unit Δ in an embodiment of the present disclosure.

Specifically, the reference time unit Δ is usually generated by a multi-stage VCO (Voltage Controlled Oscillator). Δ is the time span between any two adjacent VCO outputs. The VCO can be locked to a reference frequency of a known frequency by a phase-locked loop (PLL). As a result, the VCO frequency $f_{VCO}$ is a known value. As shown in FIG. 2, the VCO 200 has K outputs 201 having equally-spaced phases, wherein, K is a positive integer greater than one. As a result, the reference time unit Δ can be computing using the following formula:

$$\Delta = T_{VCO}/K = 1/(K@f_{VCO}) \quad (1)$$

Further, the signal generating circuit may include: a first input end, configured to receive a reference time unit Δ; a second input end, configured to receive the frequency control word F; a direct period synthesis sub-circuit, configured to create a first period $T_A$ and a second period $T_B$ different from the first period $T_A$ according to the reference time unit and the target frequency control word F; generate the clock signal by interleaving a first pulse signal having the first period $T_A$ and a second pulse signal having the second period $T_B$; an output, configured to output the clock signal.

Figure 3:
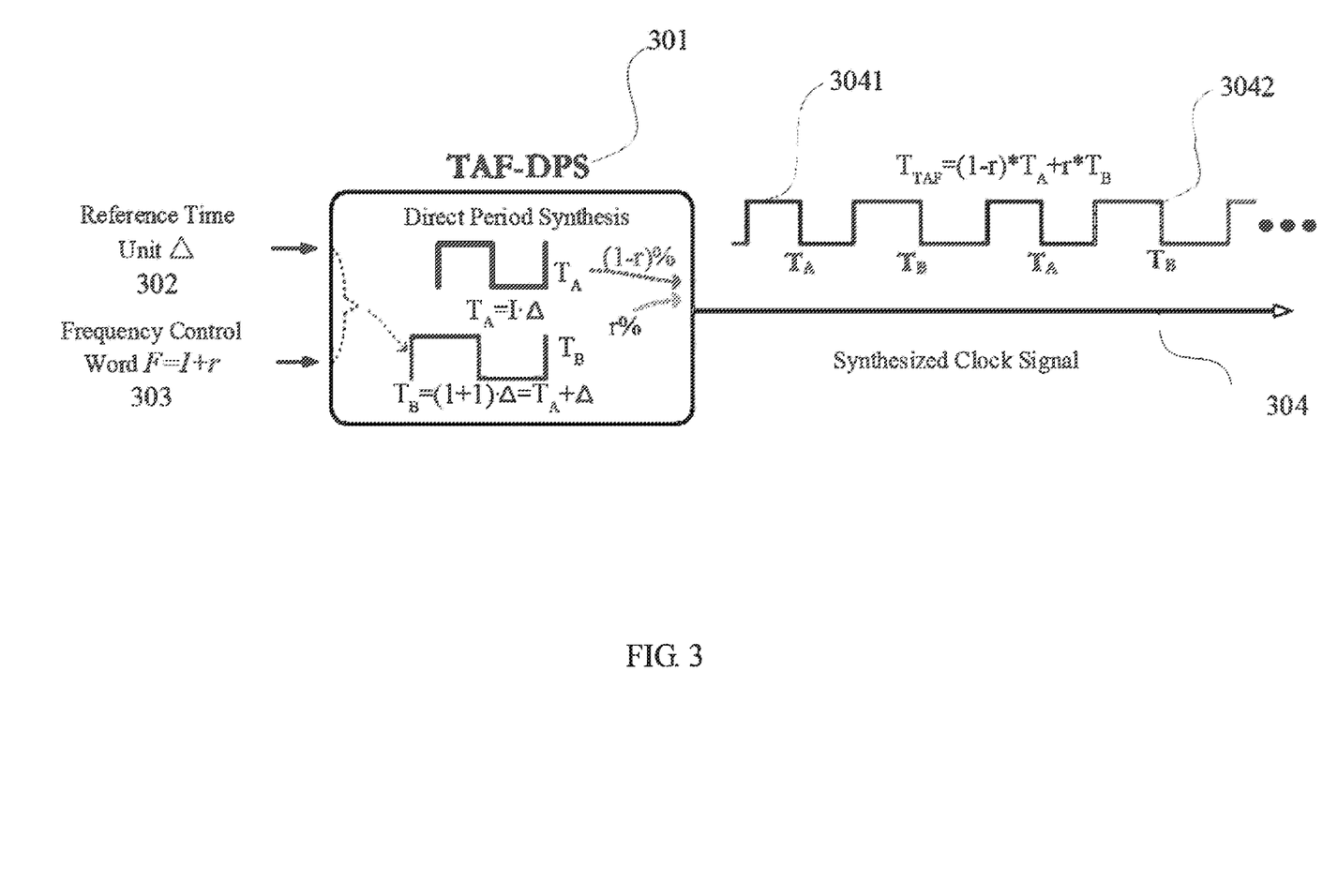
FIG. 3 is an operating principle of a TAF-DPS clock generator in an embodiment of the present disclosure.

Specifically, as shown in FIG. 3, the signal generating circuit 301 has two inputs: a reference time unit Δ 302 and a frequency control word F303, wherein, F=I+r, I is an integer part, r is a fractional part, and 0≤r<1. The signal generating circuit 301 has an output CLK 304, which is a synthesized time average frequency clock signal. Starting from the reference time unit Δ 302, the direct period synthesis sub-circuit generates two types of periods: a first period $T_A=I\times\Delta$ and a second period $T_B=(I+1)\times\Delta=T_A+\Delta$. The output CLK 304 is a clock pulse string including both types of the first period $T_A$ 3041 and the second period $T_B$ 3042. They are used in an interleaved manner, and the proportion of the first period $T_A$ and the second period $T_B$ respectively in the clock signal is controlled by r.

Still referring to FIG. 3, for the period $T_{TAF}$ of the output CLK, it can be expressed by the following formula:

$$T_{TAF} = (1-r)\times T_A + r\times T_B \quad (2)$$
$$= T_A + r\times(T_B - T_A)$$
$$= T_A + r\times\Delta$$
$$= I\times\Delta + r\times\Delta$$
$$= (I+r)\times\Delta$$

Therefore, when the frequency control word F=I+r, it will result in:

$$f_{TAF}=1/T_{TAF}=1/[(1-r)\times T_A + r\times T_B] \quad (3)$$

As can be seen from the above formula (3), the period $T_{TAF}$ of the clock signal CLK outputted by the signal generating circuit is linearly proportional to the frequency control word F. When the generated frequency control word F changes in a predetermined waveform, the period $T_{TAF}$ of the clock signal outputted by the signal generating circuit will also vary with the same waveform.

Further, since the period T is inversely proportional to the frequency f, when the predetermined condition is satisfied, for example, when the variation of the control word F is very small (less than a predetermined threshold), the frequency of the output clock signal can also approximately follow the waveform change of the frequency control word in a linear manner.

Next, a specific example of the above-described direct period synthesis sub-circuit will be described with reference to FIGS. 4 and 5.

Figure 4:
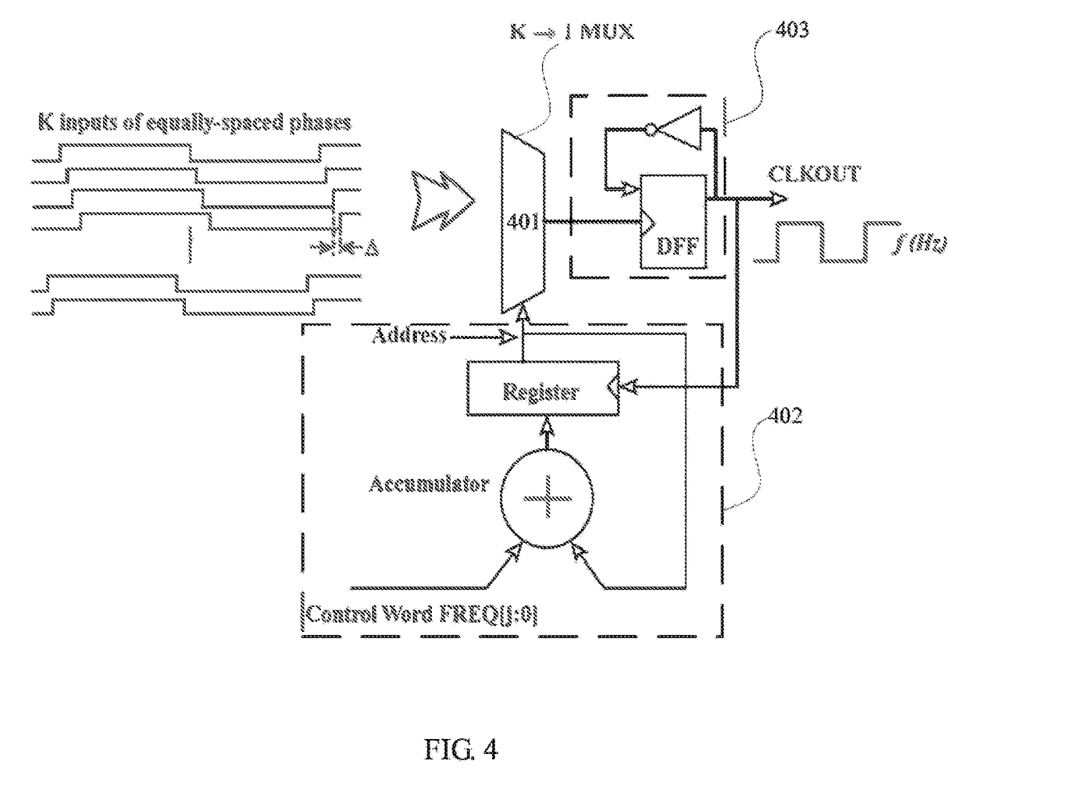
FIG. 4 is a schematic structural diagram of a TAF-DPS clock generator in an embodiment of the present disclosure.

In one scheme, referring to FIG. 4, the direct period synthesis sub-circuit may include: a first K→1 multiplexer 401, an accumulator with registered output 402 and a D-type flip-flop DFF configured as a toggle flip-flop 403; wherein, the first K→1 multiplexer 401, configured to receive K output signals from the first input and a first code address from the registered accumulator 402, and select one output signal from the K output signals to output to the DFF 403 according to the first code address; the accumulator with registered output 402, configured to receive the frequency control word F from the second input, and accumulate the frequency control word F to generate the first code address and output to the first K→1 multiplexer 401; the DFF 403, configured to receive an output signal from the first K→1 multiplexer 401; and invert the output signal to generate and output the clock signal.

Further, the above accumulator with registered output may include: a register and an accumulator, the register for registering an integer part and a fractional part of the target frequency control word F, respectively.

Figure 5:
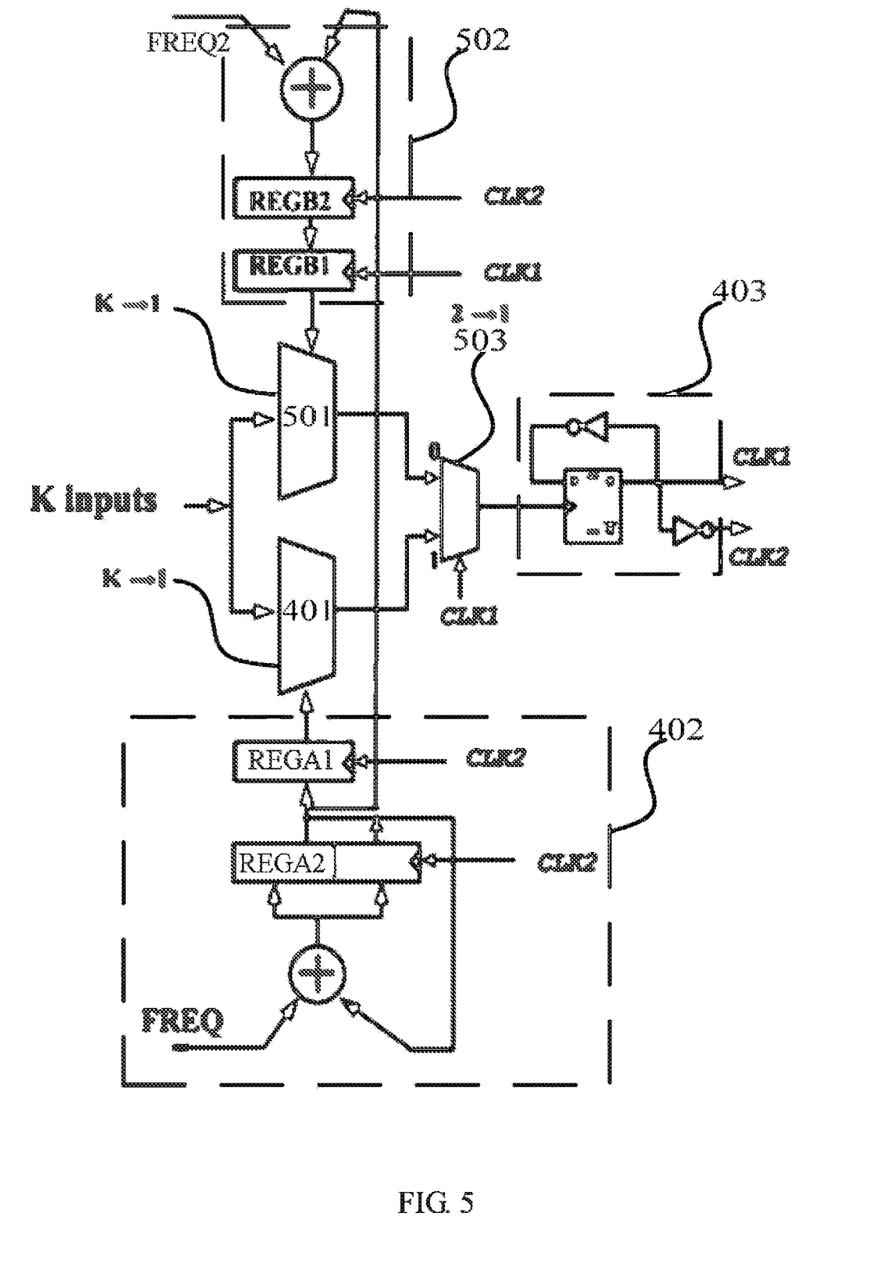
FIG. 5 is a schematic structural diagram of a TAF-DPS clock generator in an embodiment of the present disclosure.

In one scheme, referring to FIG. 5, the direct period synthesis sub-circuit may further include: a second K→1 multiplexer 501, an adder 502 and a 2→1 multiplexer 503; wherein, the second K→1 multiplexer 501, further configured to select one output signal from the K output signals to output to the 2→1 multiplexer 503 according to the first code address; the second K→1 multiplexer 501, configured to receive K output signals from the first input and a second code address from the adder 502, and select one output signal from the K output signals to output to the 2→1 multiplexer 503 according to the second code address; the adder 502, configured to receive F/2 from the third input, and add the F/2 to generate the second code address and output to the second K→1 multiplexer 501; the 2→1 multiplexer 503, configured to receive output signals from the first K→1 multiplexer 501 and the second K→1 multiplexer

501, respectively, and select an output signal among them to output to the DFF 503; the DFF 503, configured to receive an output signal from the 2→1 multiplexer 503; and invert the output signal to generate and output the clock signal.

The electronic device provided by the embodiment of the present disclosure will be described below in conjunction with the above TAF-DPS clock generator.

Figure 6:
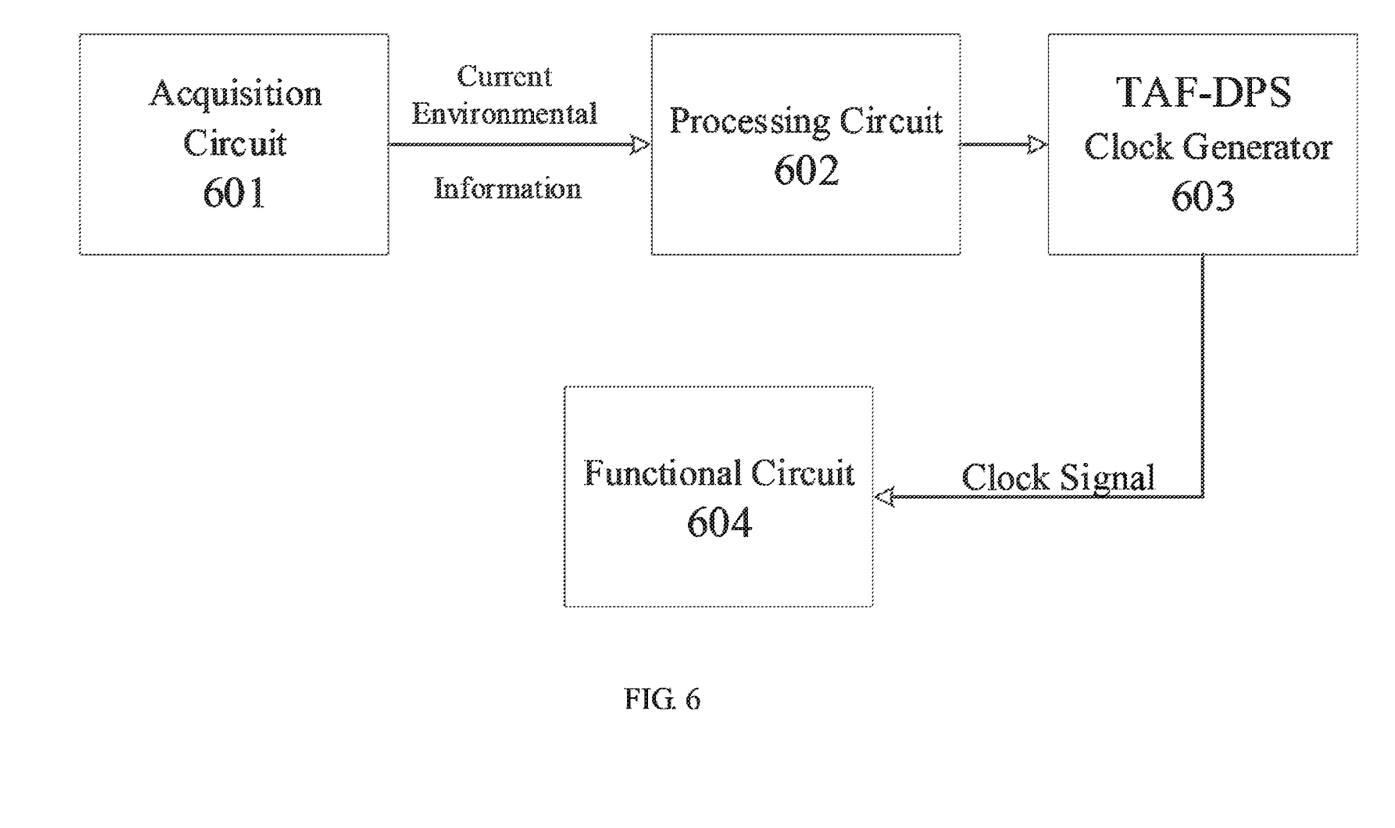
FIG. 6 is a schematic structural diagram of an electronic device in an embodiment of the present disclosure.

FIG. 6 is a schematic structural diagram of an electronic device in an embodiment of the present disclosure, referring to FIG. 6, the electronic device 600 may include: an acquisition circuit 601, a processing circuit 602, a TAF-DPS clock generator 603 and a functional circuit 604.

In the embodiment, the acquisition circuit, an acquisition circuit, configured to collect the current environmental information for characterizing the environment of the electronic device; the processing circuit, configured to receive the current environmental information from the acquisition circuit; determine a target frequency control word corresponding to the current environmental information according to a preset expected operating status of the electronic device; input the target frequency control word to the TAF-DPS clock generator; the TAF-DPS clock generator, configured to generate a clock signal according to the target frequency control word, and output the clock signal to a functional circuit; the functional circuit, configured to operate in accordance with the clock signal to make the electronic device reach the expected operating status.

In practical applications, the foregoing acquisition circuit may include various types of sensors, such as a temperature sensor, an acceleration sensor, a gyroscope, a barometric pressure sensor, and the like, and a peripheral circuit thereof; and may also be a detection circuit for different parameters, such as a current detection circuit, a voltage detection circuit, a data load detection circuit, a battery detection circuit, a CPU detection circuit, etc. Certainly, different acquisition circuits may be set for different collection objects, which are not specifically limited in the embodiment of the present disclosure. In this way, the acquisition circuit can collect the combination of one or more of ambient temperature, supply voltage, data rate, computing workload, battery power, electromagnetic interference requirements, data load, and of course, other environmental information can be collected, which are not specifically limited in the embodiment of the present disclosure. This environmental information can be used to characterize the current environment of the electronic device.

The processing circuit may include a central processing unit (CPU), a graphics processing unit (GPU), an embedded microcontroller unit (MCU), an embedded microprocessor unit (EMPU), an embedded digital signal processor (DSP) or a system on a chip (SoC), and may also include a memory, a driving circuit, and the like. The embodiment of the present disclosure is not specifically limited.

In other embodiments of the present disclosure, the processing circuit, configured to determine an expected operating parameter corresponding to the current environmental information according to a preset expected operating status of the electronic device; obtain the target frequency control word corresponding to the expected operating parameter according to a preset mapping relationship between operating parameters and frequency control words.

In a specific implementation process, the processing circuit may be configured as an environmental situation assessment sub-circuit and a digital signal processing sub-circuit; wherein the environmental situation assessment sub-circuit, configured to determine a target operating status corresponding to the current environmental information according to a preset expected operating status of the electronic device; obtain the expected operating parameter corresponding to the target operating status; the digital signal processing sub-circuit, configured to search for the expected operating parameter in the mapping relationship; acquire the corresponding target frequency control word, if the expected operating parameter is found.

Specifically, the environmental information collected by the acquisition circuit is used to characterize the environment of the electronic device, the environmental changes mentioned here may be temperature changes, supply voltage changes, data rate changes, battery power changes, electromagnetic interference requirements changes, calculation operate load changes, etc., these changes can be reflected in environmental information. Therefore, in the electronic device, the expected operating status for the electronic device in different environmental situations may be preset, for example, when the ambient temperature is 25° C., the CPU frequency is controlled to decrease, and/or the cooling fan speed is increased; or, when the electronic device is powered by battery, the CPU is controlled to operate in half-load, or when the power is supplied, the CPU is controlled to operate in full-load. Moreover, if the remaining power of the electronic device is less than 20%, the frequency of GPU is controlled to decrease, so that the power consumption of the GPU is reduced. In practical applications, different expected operating statuses may be set for the electronic device for different environmental information, and the disclosure is not specifically limited.

Then, after obtaining the current environmental information, the electronic device determines a corresponding target operating status according to the current environmental information, and then determines a corresponding expected operating parameter. Here, the expected operating parameters may be the frequency of the CPU, the rotational speed of the cooling fan, the occupancy rate of the CPU, or the refresh frequency of the GPU, etc., which are not specifically limited in the embodiment of the present disclosure. In addition, the electronic device is further provided with a preset mapping relationship between the operating parameter and the frequency control word, and the processing circuit can find the corresponding target frequency control word according to the expected operating parameter, and send the target frequency control word to the foregoing TAF-DPS clock generator.

In practical applications, the preset mapping relationship between the operating parameters and the frequency control word can exist in the form of a calculation formula, or can exist in the form of a table, which is not specifically limited in the embodiment of the present disclosure.

Next, referring to the foregoing TAF-DPS technology, the TAF-DPS clock generator can generate a clock signal having a target frequency according to the target frequency control word, and output the clock signal to the functional circuit.

Specifically, the reference time unit generating circuit generates a reference time unit and sends it to the signal generating circuit, and after receiving the target frequency control word from the processing circuit and receiving the reference time unit from the reference time unit generating circuit, the signal generating circuit generates a clock signal according to the reference time unit and the target frequency control word, where the frequency of the clock signal is controlled by the target frequency control word.

Further, after the signal generating circuit receives the reference time unit from the first input end and receives the target frequency control word F from the second input, the direct period synthesis sub-circuit creates a first period $T_A$ and a second period $T_B$ different from the first period $T_A$ according to the reference time unit and the target frequency control word F, then, generates the clock signal by interleaving a first pulse signal having the first period $T_A$ and a second pulse signal having the second period $T_B$, finally, an output outputs the clock signal to the functional circuit.

Next, the functional circuit is configured to operate in accordance with the clock signal, so that the electronic device reaches an expected operating status.

Here, the functional circuit may be a CPU, a GPU, a cooling fan, and its peripheral circuits, etc. Of course, the functional circuit can also be other circuits, and can be set by a person skilled in the art according to actual needs, and the embodiment of the present disclosure is not specifically limited.

The operating process of the electronic device according to the embodiment of the present disclosure is described below by using specific examples.

According to one example, the temperature sensor set on the electronic device collects the external environment temperature of 25° C.; then the environmental situation assessment sub-circuit in the processing circuit determines the corresponding expected operating status, which may be to reduce the frequency of the CPU, according to the preset expected operating status of the electronic device; next, according to the preset corresponding relationship between the operating status and the operating parameter, it is determined that the frequency of the CPU is reduced from 3 GHz to 1.8 GHz, that is, the expected operating parameter is that the frequency of the CPU is equal to 1.8 GHz. In the fourth step, the digital signal processing sub-circuit in the processing circuit can calculate the corresponding target frequency control word $F_{TAG}$ according to the preset calculation formula, according to the current CPU frequency of 3 GHz and the expected operating parameter of 1.8 GHz; and in the fifth step, the digital signal processing sub-circuit inputs the $F_{TAG}$ to the second input of the TAF-DPS clock generator, and the direct period synthesis sub-circuit generates a clock signal having the target frequency according to the reference time unit Δ and the target frequency control word $F_{TAG}$; finally, the TAF-DPS clock generator sends the generated clock signal to the functional circuit, that is, the CPU, in this way, the CPU operates in accordance with the clock signal, so that its own frequency is reduced to 1.8 GHz, and at this time, the electronic device reaches the expected operating status.

Figure 7:
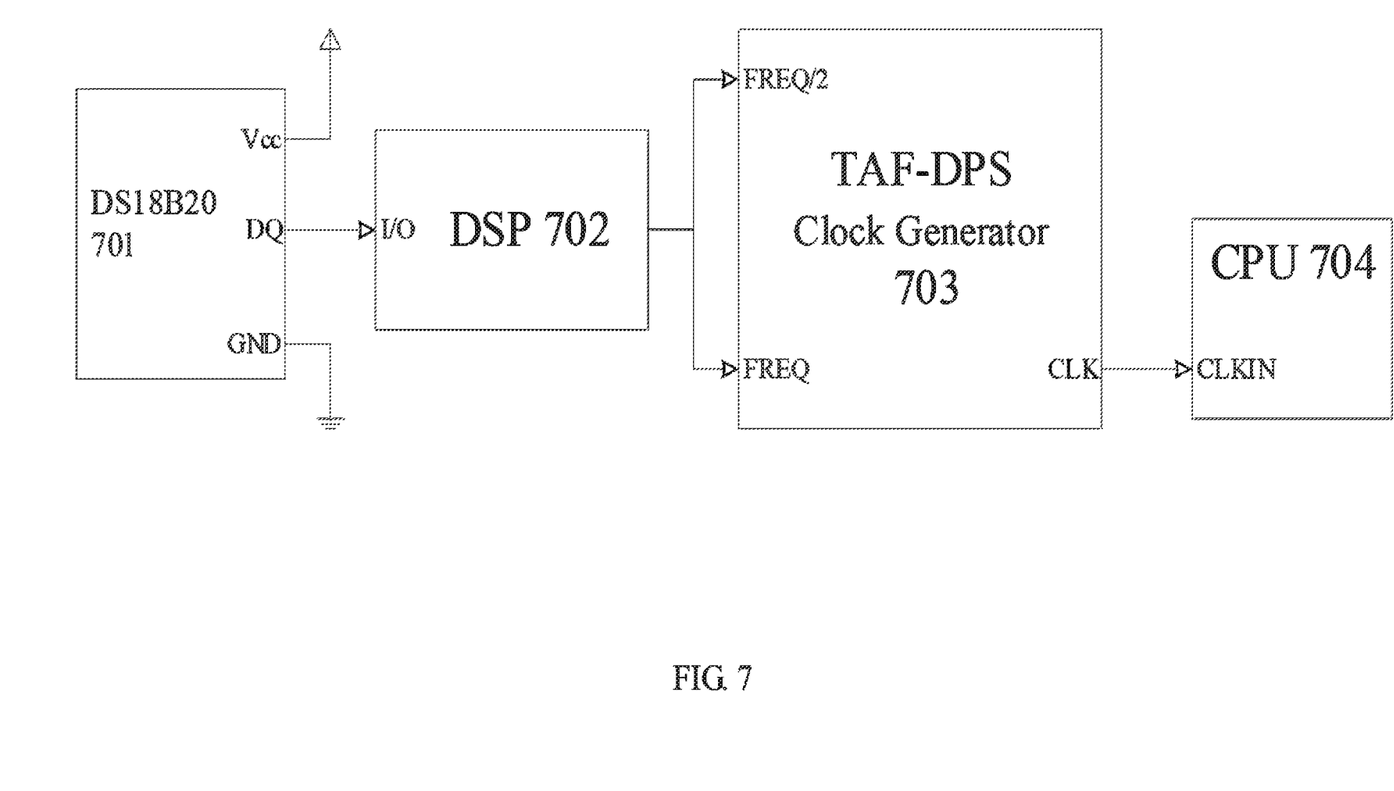
FIG. 7 is a schematic diagram 1 of an example of an operating process of an electronic device in an embodiment of the present disclosure.

For example, the acquisition circuit may specifically be a temperature sensor and the peripheral circuits, here, the temperature sensor may adopt an IC temperature sensor such as a DS18B20, LM56, MAX6501-MAX6504, MAX6509/6510, etc., and may also adopt a thermistor, a thermocouple, a resistance temperature detector, etc. FIG. 7 is a schematic diagram 1 of an example of an operating process of an electronic device in an embodiment of the present disclosure, referring to FIG. 7, the electronic device may include a DS18B20 701, a DSP 702, a TAF-DPS clock generator 703, and a CPU 704.

Among them, the DQ pin of the DS18B20 701 is the digital signal input/output end, the GND pin is the power ground, and the Vcc pin is the external power supply input end. The DQ pin is connected to the I/O interface of the DSP 702, and outputs the collected temperature signal to the DSP 702. In practical applications, the specific pin of the I/O interface is determined by the actual application and the model of the DSP, and is not specifically limited in this embodiment of the present disclosure.

Then, the DSP 702 performs processing and calculation according to the temperature signal input by the I/O interface and determines the $F_{TAG}$, and then outputs to the FREQ pin and the FREQ/2 pin of the TAF-DPS clock generator 703 through the I/O interface (such as the ADCIN0/IOPA0 pin), the TAF-DPS clock generator 703 generates a clock signal having a target frequency according to the $F_{TAG}$ and the reference time units, and the clock signal is output to the CLKIN (or XTAL1) of the CPU 704 through the CLK pin, and the CPU 704 operates according to the clock signal to adjust its own operating frequency to as low as 1.8 GHz.

According to one example, the power detecting circuit provided on the electronic device collects the remaining power of the power of 18%; then the environmental situation assessment sub-circuit in the processing circuit determines the corresponding expected operating status, which may be to reduce the frequency of the GPU, according to the preset expected operating status of the electronic device; next, according to the preset corresponding relationship between the operating status and the operating parameter, it is determined that the frequency of the GPU is reduced from 550 MHz to 200 MHz, that is, the expected operating parameter is that the frequency of the GPU is equal to 200 MHz. In the fourth step, the digital signal processing sub-circuit in the processing circuit can calculate the corresponding target frequency control word $F_{TAG}$ according to the preset calculation formula, according to the current GPU frequency of 550 MHz and the expected operating parameter of 200 MHz; and in the fifth step, the digital signal processing sub-circuit inputs the $F_{TAG}$ to the second input of the TAF-DPS clock generator, and the direct period synthesis sub-circuit generates a clock signal having the target frequency according to the reference time unit Δ and the target frequency control word $F_{TAG}$; finally, the TAF-DPS clock generator sends the generated clock signal to the functional circuit, that is, the GPU, in this way, the GPU operates in accordance with the clock signal, so that its own frequency is reduced to 200 MHz, and at this time, the electronic device reaches the expected operating status.

Figure 8:
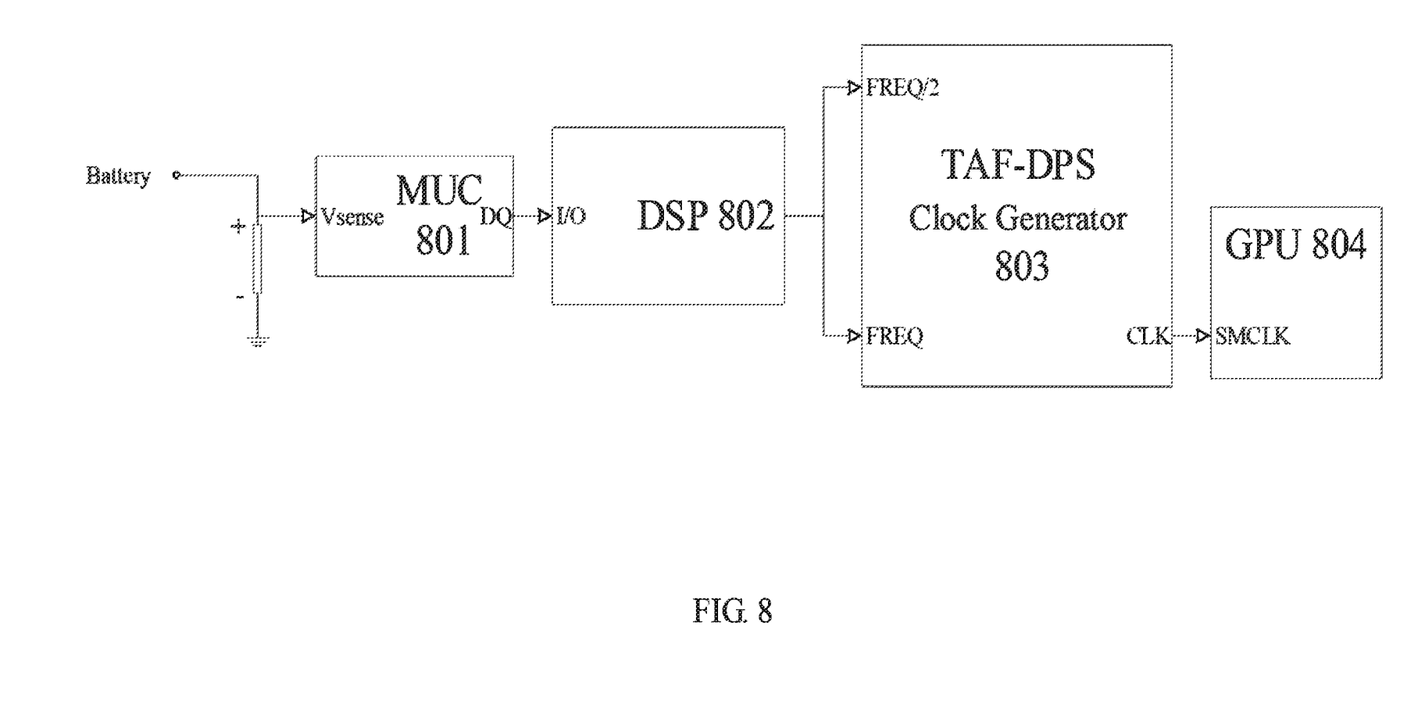
FIG. 8 is a schematic diagram 2 of an example of an operating process of an electronic device in an embodiment of the present disclosure.

For example, the acquisition circuit may specifically be a power measurement circuit, here, the power measurement circuit may adopt an intelligent measurement circuit such as a coulomb counter, a battery power measurement chip, or the like. FIG. 8 is a schematic diagram 2 of an example of an operating process of an electronic device in an embodiment of the present disclosure, referring to FIG. 8, the electronic device may include a coulomb counter composed of a detecting resistor Rsense and a MUC 801, a DSP 802, a TAF-DPS clock generator 803, and GPU 804.

In the embodiment, the external detecting resistor Rsense is used to detect the battery voltage, and the MUC 801 chip integrates this voltage (actually converted into current) and time to get the correct amount of power when the user uses it, and then according to the full capacity of the battery stored in the MUC 801 register, it is possible to calculate the remaining battery power signal, which is output from the DQ pin to the I/O interface of the DSP 802 connected to it. In practical applications, the specific pin of the I/O interface is determined by the actual application and the model of the DSP, and is not specifically limited in this embodiment of the present disclosure.

Then, the DSP performs processing and calculation according to the remaining power signal input by the I/O interface and determines the $F_{TAG}$, and then outputs to the FREQ pin and the FREQ/2 pin of the TAF-DPS clock generator 803 through the I/O interface (such as the ADCIN0/IOPA0 pin), the TAF-DPS clock generator 803 generates a clock signal having a target frequency according to the $F_{TAG}$ and the reference time units, and the clock signal is output to the SMCLK of the GPU 804 through the CLK pin, and the GPU operates according to the clock signal to decrease its own operating frequency to 200 MHz.

It should be noted that the foregoing examples are only exemplary descriptions of the operating process of the electronic device in the embodiments of the present disclosure, and the electronic devices in the embodiments of the present disclosure are not limited, and those skilled in the art may design according to actual needs, which are not specifically limited in the embodiments of the present disclosure.

It can be seen from the above that the electronic device provided by the embodiment of the present disclosure can calculate the corresponding target frequency control word according to its own environment and the preset expected operating status, and quickly adjust the frequency of the clock signal generated by the clock generator by adopting the target frequency control word to quickly adjust the operating status of the functional circuit, thereby enabling the electronic device to adaptively adjust to reach an expected operating status.

Based on the foregoing embodiments, an embodiment of the present disclosure further provides a method of controlling an electronic device, which is applied to an electronic device as described in one or more embodiments above.

Figure 9:
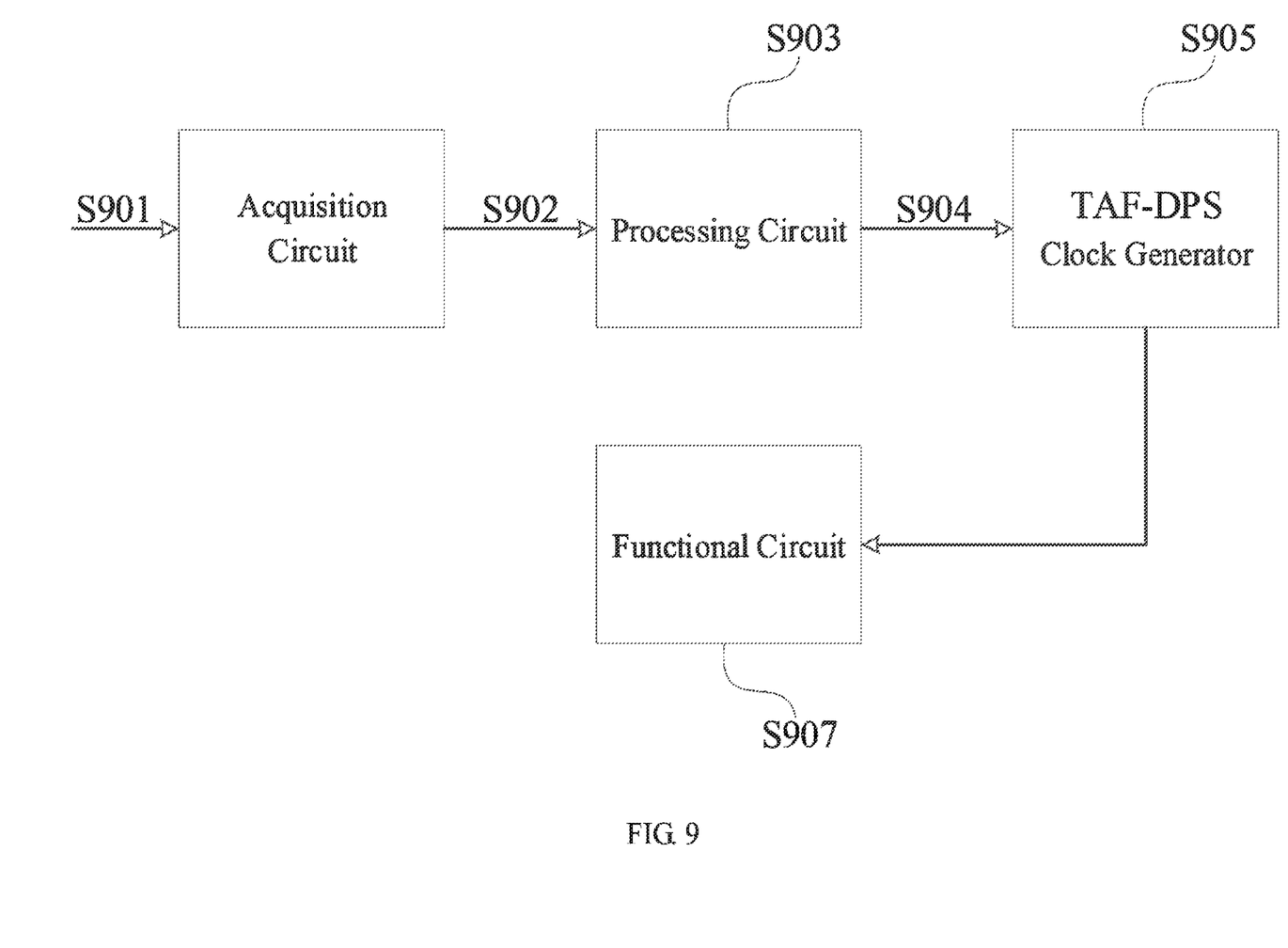
FIG. 9 is a schematic flow chart of an implementation process of a method of controlling an electronic device in an embodiment of the present disclosure.

FIG. 9 is a schematic flow chart of an implementation of a method of controlling an electronic device in an embodiment of the present disclosure, referring to FIG. 9, the method includes:

S901: the acquisition circuit collects the current environmental information for characterizing the environment of the electronic device;

S902: the acquisition circuit sends the current environmental information to the processing circuit;

S903: the processing circuit determines a target frequency control word corresponding to the current environmental information according to a preset expected operating status of the electronic device S904: the processing circuit inputs the target frequency control word to the TAF-DPS clock generator;

S905: the TAF-DPS clock generator generates a clock signal according to the target frequency control word;

S906: the TAF-DPS clock generator outputs a clock signal to the functional circuit;

S907: the functional circuit operates in accordance with the clock signal to make the electronic device reach the expected operating status.

In the embodiment of the present disclosure, in order to implement the adaptive adjustment of the electronic device, the S803 may include: determining an expected operating parameter corresponding to the current environmental information according to a preset expected operating status of the electronic device; obtaining the target frequency control word corresponding to the expected operating parameter according to preset mapping relationship between operating parameters and frequency control words.

In practical applications, the step of determining an expected operating parameter corresponding to the current environmental information according to a preset expected operating status of the electronic device may include: determining a target operating status corresponding to the current environmental information according to a preset expected operating status of the electronic device; obtaining the expected operating parameter corresponding to the target operating status; correspondingly, the step of obtaining the target frequency control word corresponding to the expected operating parameter according to preset mapping relationship between operating parameters and frequency control words, may include: searching for the expected operating parameter in the mapping relationship; acquiring the corresponding target frequency control word, if the expected operating parameter is found.

Specifically, the environmental information collected by the acquisition circuit is used to characterize the environment of the electronic device, the environmental changes mentioned here may be temperature changes, supply voltage changes, data rate changes, battery power changes, electromagnetic interference requirements changes, calculation operate load changes, etc., these changes can be reflected in environmental information. Therefore, in the electronic device, the expected operating status for the electronic device in different environmental situations may be preset, for example, when the ambient temperature is 25° C., the CPU frequency is controlled to decrease, and/or the cooling fan speed is increased; or, when the electronic device is powered by battery, the CPU is controlled to operate in half-load, or when the power is supplied, the CPU is controlled to operate in full-load; Moreover, if the remaining power of the electronic device is less than 20%, the frequency of GPU is controlled to decrease, so that the power consumption of the GPU is reduced. In practical applications, different expected operating statuses may be set for the electronic device for different environmental information, and the disclosure is not specifically limited.

Then, after obtaining the current environmental information, the electronic device determines a corresponding target operating status according to the current environmental information, and then determines a corresponding expected operating parameter. Here, the expected operating parameters may be the frequency of the CPU, the rotational speed of the cooling fan, the occupancy rate of the CPU, or the refresh frequency of the GPU, etc., which are not specifically limited in the embodiment of the present disclosure. In addition, the electronic device is further provided with a preset mapping relationship between the operating parameter and the frequency control word, and the processing circuit can find the corresponding target frequency control word according to the expected operating parameter, and send the target frequency control word to the foregoing TAF-DPS clock generator.

In an embodiment of the present disclosure, the current environmental information includes a combination of one or more of an ambient temperature, a supply voltage, a data rate, a computing workload, a battery power, an electromagnetic interference requirement, and a data load.

It should be noted here that the description of the above method embodiments is similar to the description of the above electronic device embodiment, and has similar beneficial effects as the electronic device embodiment. For technical details not disclosed in the method embodiments of the present disclosure, please refer to the description of the embodiments of the electronic device of the present disclosure.

Based on the same disclosure concept, an embodiment of the present disclosure further provides a method of controlling an electronic device, which is applied to a processing circuit provided in the electronic device described in one or more of the above embodiments.

Figure 10:
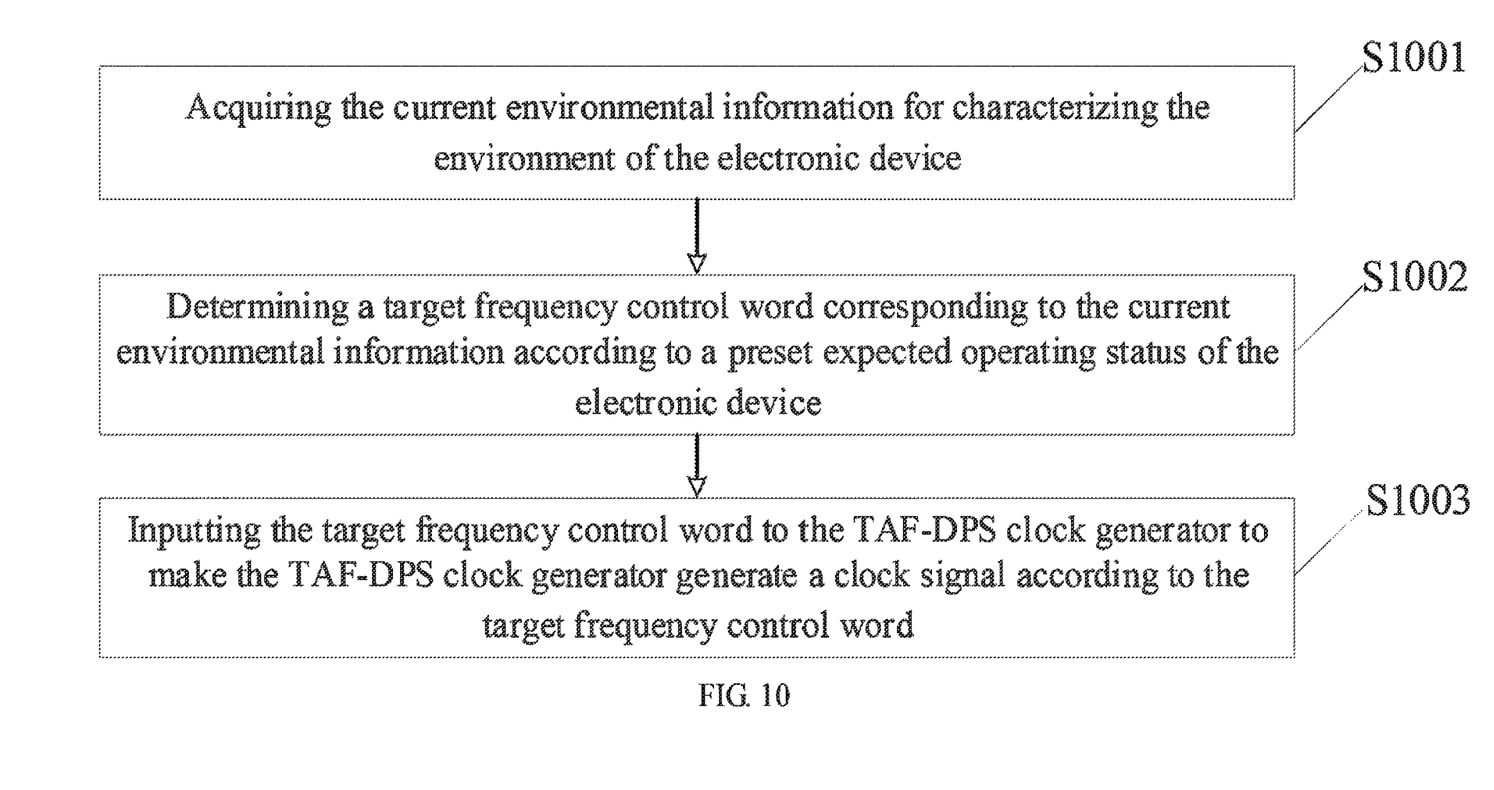
FIG. 10 is a schematic flow chart of an implementation process of a method of controlling an electronic device on a processing circuit side in an embodiment of the present disclosure.

FIG. 10 is a schematic flow chart of an implementation process of a method of controlling an electronic device on a processing circuit side in an embodiment of the present disclosure, referring to FIG. 10, the method includes:

S1001: acquiring the current environmental information for characterizing the environment of the electronic device;

S1002: determining a target frequency control word corresponding to the current environmental information according to a preset expected operating status of the electronic device;

S1003: inputting the target frequency control word to the TAF-DPS clock generator to make the TAF-DPS clock generator generate a clock signal according to the target frequency control word.

In one embodiment, the clock signal is used to control the operating of the functional circuit to make the electronic device reach the expected operating status.

In the embodiment of the present disclosure, in order to implement the adaptive adjustment of the electronic device, the S902 may include: determining an expected operating parameter corresponding to the current environmental information according to a preset expected operating status of the electronic device; obtaining the target frequency control word corresponding to the expected operating parameter according to preset mapping relationship between operating parameters and frequency control words.

In the embodiment of the present disclosure, the step of determining an expected operating parameter corresponding to the current environmental information according to a preset expected operating status of the electronic device may include: determining a target operating status corresponding to the current environmental information according to a preset expected operating status of the electronic device; obtaining the expected operating parameter corresponding to the target operating status; correspondingly, the step of obtaining the target frequency control word corresponding to the expected operating parameter according to preset mapping relationship between operating parameters and frequency control words, may include: searching for the expected operating parameter in the mapping relationship; acquiring the corresponding target frequency control word, if the expected operating parameter is found.

Specifically, the environmental information collected by the acquisition circuit is used to characterize the environment of the electronic device, the environmental changes mentioned here may be temperature changes, supply voltage changes, data rate changes, battery power changes, electromagnetic interference requirements changes, calculation operate load changes, etc., these changes can be reflected in environmental information. Therefore, in the electronic device, the expected operating status for the electronic device in different environmental situations may be preset, for example, when the ambient temperature is 25° C., the CPU frequency is controlled to decrease, and/or the cooling fan speed is increased; or, when the electronic device is powered by battery, the CPU is controlled to operate in half-load, or when the power is supplied, the CPU is controlled to operate in full-load; Moreover, if the remaining power of the electronic device is less than 20%, the frequency of GPU is controlled to decrease, so that the power consumption of the GPU is reduced. In practical applications, different expected operating statuses may be set for the electronic device for different environmental information, and the disclosure is not specifically limited.

Then, after obtaining the current environmental information, the electronic device determines a corresponding target operating status according to the current environmental information, and then determines a corresponding expected operating parameter. Here, the expected operating parameters may be the frequency of the CPU, the rotational speed of the cooling fan, the occupancy rate of the CPU, or the refresh frequency of the GPU, etc., which are not specifically limited in the embodiment of the present disclosure. In addition, the electronic device is further provided with a preset mapping relationship between the operating parameter and the frequency control word, and the processing circuit can find the corresponding target frequency control word according to the expected operating parameter, and send the target frequency control word to the foregoing TAF-DPS clock generator.

In an embodiment of the present disclosure, the current environmental information includes a combination of one or more of an ambient temperature, a supply voltage, a data rate, a computing workload, a battery power, an electromagnetic interference requirement, and a data load.

It should be noted here that the description of the above method embodiments is similar to the description of the above electronic device embodiment, and has similar beneficial effects as the electronic device embodiment. For technical details not disclosed in the method embodiments of the present disclosure, please refer to the description of the embodiments of the electronic device of the present disclosure.

The embodiment of the present disclosure provides a method of controlling an electronic device and an electronic device, the electronic device includes an acquisition circuit, a processing circuit, and a Time-Average-Frequency Direct Period Synthesis (TAF-DPS) clock generator and a functional circuit. First, the acquisition circuit collects the current environmental information for characterizing the environment of the electronic device and send to the processing circuit, then, after the processing circuit receives the current environmental information from the acquisition circuit, determining a target frequency control word corresponding to the current environmental information according to a preset expected operating status of the electronic device, next, the processing circuit inputs the target frequency control word to the TAF-DPS clock generator, so that the TAF-DPS clock generator generates a clock signal according to the target frequency control word, and outputs the clock signal to a functional circuit, thereby controlling the functional circuit to operate in accordance with the clock signal to make the electronic device reach the expected operating status. It can be seen that, in the technical solution provided by the present disclosure, the electronic device can calculate the corresponding target frequency control word according to its own environment and the expected operating status that is preset, and quickly adjust the frequency of the clock signal generated by the clock generator by adopting the target frequency control word to quickly adjust the operating status of the functional circuit, thereby enabling the electronic device to adaptively adjust to reach an expected operating status.

Those skilled in the art should appreciate that embodiments of the present disclosure can be provided as a method, system, or computer program product. Accordingly, the present disclosure may take the form of an entirely hardware embodiment, an entirely software embodiment, or a combination of software and hardware aspects. Moreover, the present disclosure may take the form of a computer program product embodied on one or more computer-usable storage media (including but not limited to disk storage, CD-ROM, optical storage, etc.) including computer usable program code.

The present disclosure is described with reference to flow chart illustrations and/or block diagrams of methods, apparatus (system), and computer program products according to embodiments of the present disclosure. It should be understood that each of the processes and/or blocks of the flowcharts and/or block diagrams, and combinations of the flows and/or blocks in the flowcharts and/or block diagrams can be implemented by computer program instructions. These computer program instructions can be provided to a general purpose computer, special purpose computer, embedded processor, or other programmable data processing device to produce a machine, so that the instructions executed by a processor of a computer or other programmable data processing device functions as the devices for implementing the functions specified in one or more processes of the flow chart and/or in one or more blocks of the block diagrams.

These computer program instructions can also be loaded onto a computer or other programmable data processing device to make that a series of operational steps are performed on a computer or other programmable device to produce computer implemented processing, so that the instructions executed on a computer or other programmable device are provided to implement the steps of the functions specified in one or more processes of the flow chart and/or in one or more blocks of the block diagrams.

The computer program instructions can also be stored in a computer readable memory that can direct a computer or other programmable data processing device to operate in a particular manner, such that the instructions stored in the computer readable memory produce an article of manufacture including the instruction device. The apparatus implements the functions specified in one or more blocks of a flow or a flow and/or block diagram of the flowchart.

Although the preferred embodiments of the present disclosure have been described, additional changes and modifications may be made to those embodiments once the basic inventive concept is known to those skilled in the art. Therefore, the appended claims are intended to be interpreted as including the preferred embodiments and all the changes and modifications falling within the scope of the present disclosure.

Obviously, various modifications and changes can be made in the present disclosure for those skilled in the art without departing from the spirit and scope of the disclosure. Thus, if such modifications and variations of the present disclosure are within the scope of the appended claims and their equivalents, the present disclosure is intended to include such modifications and variations.

What is claimed is:

1. An electronic device, comprising:
an acquisition circuit, configured to collect current environmental information for characterizing an environment of the electronic device;
a processing circuit, configured to receive the current environmental information from the acquisition circuit; to determine a target frequency control word corresponding to the current environmental information according to a preset expected operating status of the electronic device; and to input the target frequency control word to a TAF-DPS (Time-Average-Frequency Direct Period Synthesis) clock generator;
the TAF-DPS clock generator, configured to generate a clock signal according to the target frequency control word, and to output the clock signal to a functional circuit; and
the functional circuit, configured to operate in accordance with the clock signal to make the electronic device reach the expected operating status,
wherein the processing circuit is configured to determine an expected operating parameter corresponding to the current environmental information according to the preset expected operating status of the electronic device; and to obtain the target frequency control word corresponding to the expected operating parameter according to a preset mapping relationship between operating parameters and frequency control words.

2. The electronic device of claim 1, wherein the processing circuit is configured as an environmental assessment sub-circuit and a digital signal processing sub-circuit;
the environmental situation assessment sub-circuit is configured to determine a target operating status corresponding to the current environmental information according to the preset expected operating status of the electronic device; and to obtain the expected operating parameter corresponding to the target operating status; and
the digital signal processing sub-circuit is configured to search for the expected operating parameter in the mapping relationship; and to acquire corresponding target frequency control word in the case where the expected operating parameter is found.

3. The electronic device according to claim 1, wherein the current environmental information comprises: one or a combination of ambient temperature, supply voltage, data rate, computing workload, battery power, electromagnetic interference requirements, or data load.

4. An electronic device, comprising:
an acquisition circuit, configured to collect current environmental information for characterizing an environment of the electronic device;
a processing circuit, configured to receive the current environmental information from the acquisition circuit to determine a target frequency control word corresponding to the current environmental information according to a preset expected operating status of the electronic device; and to input the target frequency control word to a TAF-DPS (Time-Average-Frequency Direct Period Synthesis) clock generator;
the TAF-DPS clock generator, configured to generate a clock signal according to the target frequency control word, and to output the clock signal to a functional circuit; and
the functional circuit, configured to operate in accordance with the clock signal to make the electronic device reach the expected operating status,
wherein the TAF-DPS clock generator comprises:
a reference time unit generating circuit, configured to generate a reference time unit;
a signal generating circuit, configured to receive the target frequency control word from the processing circuit and to receive the reference time unit from the reference time unit generating circuit; and to generate the clock signal according to the reference time unit and the target frequency control word, wherein a frequency of the clock signal is controlled by the target frequency control word.

5. The electronic device according to claim 4, wherein the reference time unit generating circuit comprises: a voltage controlled oscillator, a phase locked loop circuit, and K output terminals;
wherein the voltage controlled oscillator oscillates at a predetermined oscillation frequency, the phase locked loop circuit locks an output frequency of the voltage controlled oscillator to a reference frequency; and the K output terminals output K output signals having equally-spaced phases, wherein K is a positive integer greater than 1, the reference time unit is a span between any two adjacent output signals output by the K outputs.

6. The electronic device according to claim 5, wherein the signal generating circuit comprises:
a first input, configured to receive the reference time unit;
a second input, configured to receive the target frequency control word F;
a direct period synthesis sub-circuit, configured to create a first period $T_A$ and a second period $T_B$ different from the first period $T_A$ according to the reference time unit and the target frequency control word F; and to generate the clock signal by interleaving a first pulse signal having the first period $T_A$ and a second pulse signal having the second period $T_B$; and
an output, configured to output the clock signal to the functional circuit.

7. The electronic device according to claim 6, wherein F=I+r, I is an integer part, r is a fractional part, 0≤r<1; the first period $T_A$=I×Δ, the second period $T_B$=(I+1)×Δ=$T_A$+Δ; and a proportion of the first period $T_A$ and a proportion of the second period $T_B$ respectively in the clock signal is controlled by r.

8. The electronic device according to claim 7, wherein a time average frequency of the clock signal is:

$$f_{TAF}=1/T_{TAF}=1/[(1-r)\times T_A+r\times T_B]$$

wherein $T_{TAF}$ is a time average period of the clock signal.

9. The electronic device of claim 6, wherein the direct period synthesis sub-circuit comprises: a first K→1 multiplexer, an accumulator with registered output and a DFF (D-type flip-flop) configured as a toggle flip-flop;
wherein the first K→1 multiplexer is configured to receive the K output signals from the first input and a first code address from the registered accumulator, and to select one output signal from the K output signals to output to the DFF according to the first code address;
the accumulator with registered output is configured to receive the target frequency control word F from the second input, and to accumulate the target frequency control word F to generate the first code address and to output to the first K→1 multiplexer; and
the DFF is configured to receive an output signal from the first K→1 multiplexer; and to invert the output signal to generate and output the clock signal.

10. The electronic device of claim 9, wherein the accumulator with registered output comprises: a register and an accumulator, the register is configured to register the integer part and the fractional part of the target frequency control word F, respectively.

11. The electronic device of claim 9, wherein the direct period synthesis sub-circuit further comprises: a second K→1 multiplexer, an adder, and a 2→1 multiplexer; wherein,
the first K→1 multiplexer is further configured to select one output signal from the K output signals to output to the 2→1 multiplexer according to the first code address;
the second K→1 multiplexer is configured to receive K output signals from the first input and a second code address from the adder, and to select one output signal from the K output signals to output to the 2→1 multiplexer according to the second code address;

the adder is configured to receive F/2 from a third input, and to perform adding on the F/2 to generate the second code address and to output to the second K→1 multiplexer;
the 2→1 multiplexer is configured to receive output signals from the first K→1 multiplexer and the second K→1 multiplexer, respectively, and to select an output signal among the output signals to output to the DFF; and
the DFF is configured to receive one output signal from the 2→1 multiplexer; and to invert the one output signal to generate and output the clock signal.

12. A method of controlling an electronic device, applied in an electronic device comprising an acquisition circuit, a processing circuit, a TAF-DPS clock generator, and a functional circuit, the method comprising:
collecting the current environmental information for characterizing the environment of the electronic device;
determining the target frequency control word corresponding to the current environmental information according to the preset expected operating status of the electronic device; and inputting the target frequency control word to the TAF-DPS (Time-Average-Frequency Direct Period Synthesis) clock generator;
generating the clock signal according to the target frequency control word, and outputting the clock signal to the functional circuit;
operating in accordance with the clock signal to make the electronic device reach the expected operating status,
wherein the step of determining the target frequency control word corresponding to the current environmental information according to the preset expected operating status of the electronic device comprises:
determining an expected operating parameter corresponding to the current environmental information according to the preset expected operating status of the electronic device; and
obtaining the target frequency control word corresponding to the expected operating parameter according to a preset mapping relationship between operating parameters and frequency control words.

13. The method according to claim 12, wherein the step of determining an expected operating parameter corresponding to the current environmental information according to the preset expected operating status of the electronic device comprises: determining a target operating status corresponding to the current environmental information according to the preset expected operating status of the electronic device; and obtaining the expected operating parameter corresponding to the target operating status; and
the step of obtaining the target frequency control word corresponding to the expected operating parameter according to a preset mapping relationship between operating parameters and frequency control words comprises: searching for the expected operating parameter in the mapping relationship; and acquiring the corresponding target frequency control word in the case where the expected operating parameter is found.

14. The method of claim 12, wherein the current environmental information comprises: one or a combination of an ambient temperature, a supply voltage, a data rate, a computing workload, a battery power, an electromagnetic interference requirement, or a data load.

* * * * *